United States Patent
Shum et al.

(10) Patent No.: US 6,327,182 B1
(45) Date of Patent: Dec. 4, 2001

(54) SEMICONDUCTOR DEVICE AND A METHOD OF OPERATION THE SAME

(75) Inventors: Danny Pak-Chum Shum; Juan Buxo; John P. Hansen, all of Austin; Scott W. Krueger, Leander; James David Burnett, Austin, all of TX (US); Eric Johan Salter, Scottsdale, AZ (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/472,920

(22) Filed: Dec. 27, 1999

Related U.S. Application Data

(63) Continuation-in-part of application No. 09/342,725, filed on Jun. 29, 1999, now abandoned, which is a continuation-in-part of application No. 09/102,268, filed on Jun. 22, 1998, now abandoned.

(51) Int. Cl.[7] .................................................. G11C 16/04
(52) U.S. Cl. .............................. 365/185.17; 365/185.05; 365/185.11; 257/316
(58) Field of Search ......................... 365/185.17, 185.11, 365/185.01, 185.05; 257/315, 316

(56) References Cited

U.S. PATENT DOCUMENTS

| | | | |
|---|---|---|---|
| 4,380,804 | 4/1983 | Lockwood et al. | 365/184 |
| 4,855,955 | 8/1989 | Cloaca | 365/185 |
| 4,959,812 | * 9/1990 | Momodomi et al. | 365/185.17 |
| 5,170,373 | 12/1992 | Doyle et al. | 365/185 |
| 5,471,422 | 11/1995 | Chang et al. | 365/185.26 |
| 5,621,233 | 4/1997 | Sharma et al. | 257/316 |
| 5,646,060 | 7/1997 | Chang et al. | 437/43 |
| 5,717,636 | 2/1998 | Dallabora et al. | 365/185.13 |
| 5,748,538 | 5/1998 | Lee et al. | 365/185.06 |

FOREIGN PATENT DOCUMENTS 7-192486    7/1995   (JP) ................................ G11C/16/06

OTHER PUBLICATIONS

Atsushi Nozoe et al., "A 3.3V High–Density AND Flash Memory with 1 ms/512B Erase & Program Time", Paper TA 7.3, 1995 IEEE International Solid State Circuits Conference, Flash Memory, pp. 124–125.

* cited by examiner

Primary Examiner—Hoai V. Ho

(57) ABSTRACT

A semiconductor device having a memory array includes memory cells (101–104), a word line (42), a first bit line (68), and a second bit line (76). Within the memory array, the first and second bit lines (68 and 76) lie at different elevations above the word line (42). Local interconnects (58) are electrically connected to the first bit line (68) and some of the current carrying electrodes (48) in the memory array. The local interconnects (58) allow offset connections to be made. For floating gate memory cells (101–104) in a NOR-type memory array architecture, programming and erasing can be performed using a relatively uniform bias between the source and drain regions (46 and 48) of a memory cell (101) to be programmed without significantly disturbing data in adjacent floating gate memory cells (102–104).

12 Claims, 6 Drawing Sheets

SEMICONDUCTOR DEVICE AND A METHOD OF OPERATION THE SAME

RELATED APPLICATIONS

This is a continuation-in-part of U.S. patent application Ser. No. 09/342,725, entitled "Semiconductor Device and a Method of Operating the Same" filed on Jun. 29, 1999 now abandoned which is a continuation-in-part of U.S. patent application Ser. No. 09/102,268, entitled "Non-Volatile Memory Array and Method For Operating Same" filed on Jun. 22, 1998 now abandoned. This is related to U.S. patent application Ser. No. 08/997,714, entitled "Semiconductor Device, Memory Cell, and Processes for Forming Them" filed on Dec. 23, 1997, and Ser. No. 09/342,470, entitled "Semiconductor Device Memory Cell and Method For Selectively Erasing the Same" filed on Jun. 29, 1999. All these applications are assigned to the current assignee hereof and are incorporated herein by reference.

FIELD OF THE INVENTION

This invention relates in general to semiconductor devices, and more particularly, to semiconductor devices having memory cells and methods of operating the memory cells.

RELATED ART

Floating gate memory cells are used in many semiconductor devices. The two most common memory architectures for floating gate memory arrays are NAND-type and NOR-type. FIG. 1 includes a circuit schematic drawing of a portion of a floating gate memory array 15 having a NAND-type architecture. The word lines 19 form rows, and the memory cells 17 are connected in series along a column for a byte or word of data. The drain of a memory cell 17 is connected to the source of a different memory cell 17. For a set of memory cells 17 corresponding to a byte or a word of data, only one drain for those memory cells 17 is connected to a drain bit line.

FIG. 2 includes a circuit schematic drawing of a portion of a floating gate memory array 10 having a NOR-type architecture. The control gates lie along a row of memory cells and are connected by a word line 12. Four memory cells are illustrated in FIG. 1. Unlike the NAND-type architecture, the memory cells 11 along each column are connected in parallel for a byte or word of data. The memory cells 11 have sources that are connected to a dedicated to a source bit line 13 and drains that are connected to dedicated drain bit lines 14. As used in this specification, a dedicated bit line is a bit line that is connected to only one row or one column of memory cells.

FIG. 3 includes a plan view of one embodiment of the memory array illustrated in FIG. 2. The layout illustrated in FIG. 3 has active regions 30 that are surrounded by field isolation regions 31. Although most of the active regions 30 are formed as strips, there are flags extending outward underneath the boxed Xs illustrated in FIG. 3. Therefore, for the left hand active region 30 near the upper left-hand side of FIG. 3, a portion of the active region 30 extends to the right to underlie the drain bit line 14 closer to the left-hand side of FIG. 3. The active region 30 continues down FIG. 3 until about the middle of the figure and then extends out with another flag but this time to the left underneath the boxed Xs for the source bit line 13 that is closer to the left-hand side of FIG. 3. The active region 30 continues down and has yet another flag extending to the right again underneath the drain bit line 14 closer to the left-hand side of FIG. 3. The other active region 30 (closer to the right-hand side of FIG. 3) has a similar pattern.

Floating gates 122 overlie the active regions 30 and are covered by the word lines 12 that include control gates. After the formation of the word lines 12, the dedicated source bit lines 13 and drain bit lines 14 are formed at the same feature level (i.e., metal 1, etc.). A minimum space 34 lies between the dedicated source bit line 13 and drain bit line 14 within a memory cell, and another minimum metal space 32 lies between dedicated source bit line 13 and drain bit line 14 of different memory cells. The ability to shrink this cell is greatly limited by these space dimensions because all the dedicated source bit lines and drain bit lines are formed at the same feature level.

Different methods can be used to program the memory cells in memory arrays 15 and 10 of FIGS. 1 and 2, respectively. Each of the memory cells 17 in the NAND-type memory array 15 of FIG. 1 can be programming using Fowler-Nordheim tunneling. In one programming method, the source, drain, and well regions are typically taken to approximately −5 volts and the control gate is taken to approximately +10 volts. As used in this specification, uniform channel biasing means that the source, drain, and well regions are at the same potential during an operation, such as programming.

A floating gate memory cell in a NOR-type architecture can be programmed by hot carrier (electron) injection or Fowler-Nordheim tunneling. With Fowler-Nordheim tunneling, typically only one of the source or drain regions for a memory cell is biased. Therefore, just like hot electron injection, most of the carriers pass to or from the floating gate through a relatively small area where the floating gate overlaps the source region or the drain region. Uniform channel biasing during programming, such as that used for NAND-type architectures, typically causes write disturb problems in NOR-type architectures, particularly those having bit lines shared between adjacent columns of memory cells.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

A semiconductor device having a memory array includes memory cells, a word line, a first bit line, and a second bit line. Within the memory array, the first and second bit lines lie at different elevations above the word line. Local interconnects are electrically connected to the first bit line and some of the current carrying electrodes in the memory array. The local interconnects allow offset connections to be made. For floating gate memory cells in a NOR-type memory array architecture, programming or erasing can be performed using a substantially uniform bias between the source and drain regions of a memory cell to be operated without significantly disturbing data in adjacent floating gate memory cells. The present invention is defined in the claims and is better understood after reading the embodiments that are described herein.

Figure 1:
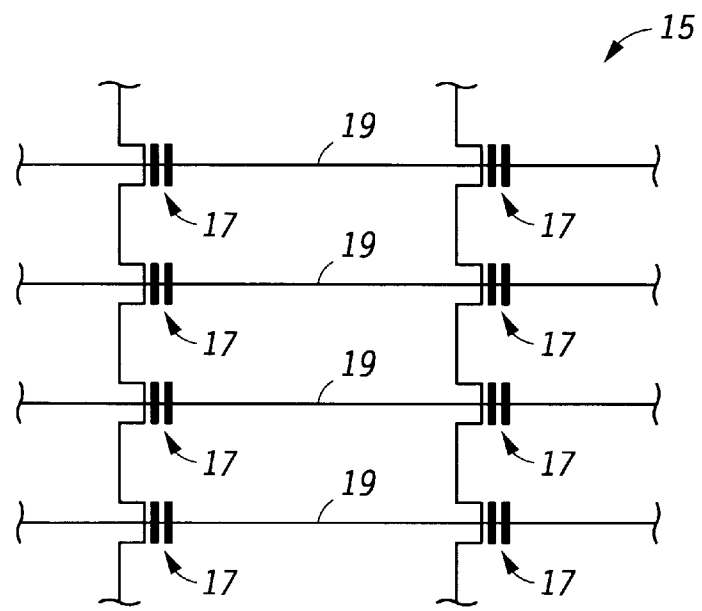
FIGS. 1 and 2 include circuit schematic drawings of portions of floating gate memory arrays (prior art)
Figure 2:
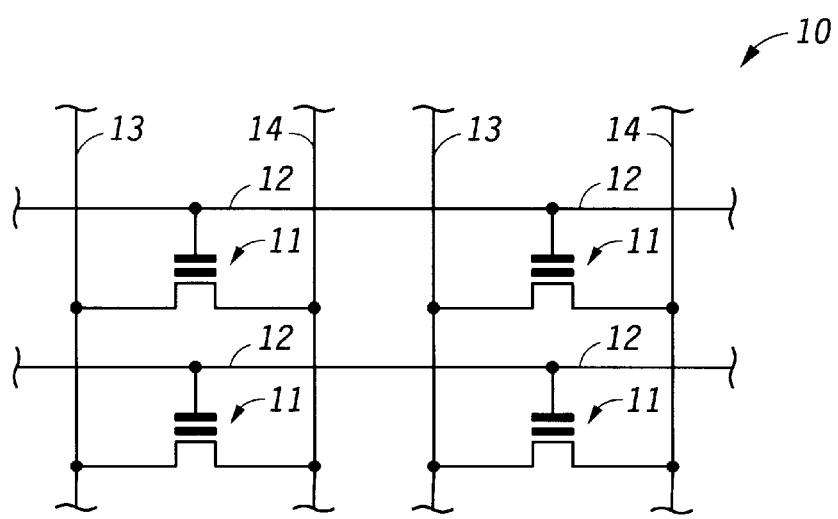
Figure 3:
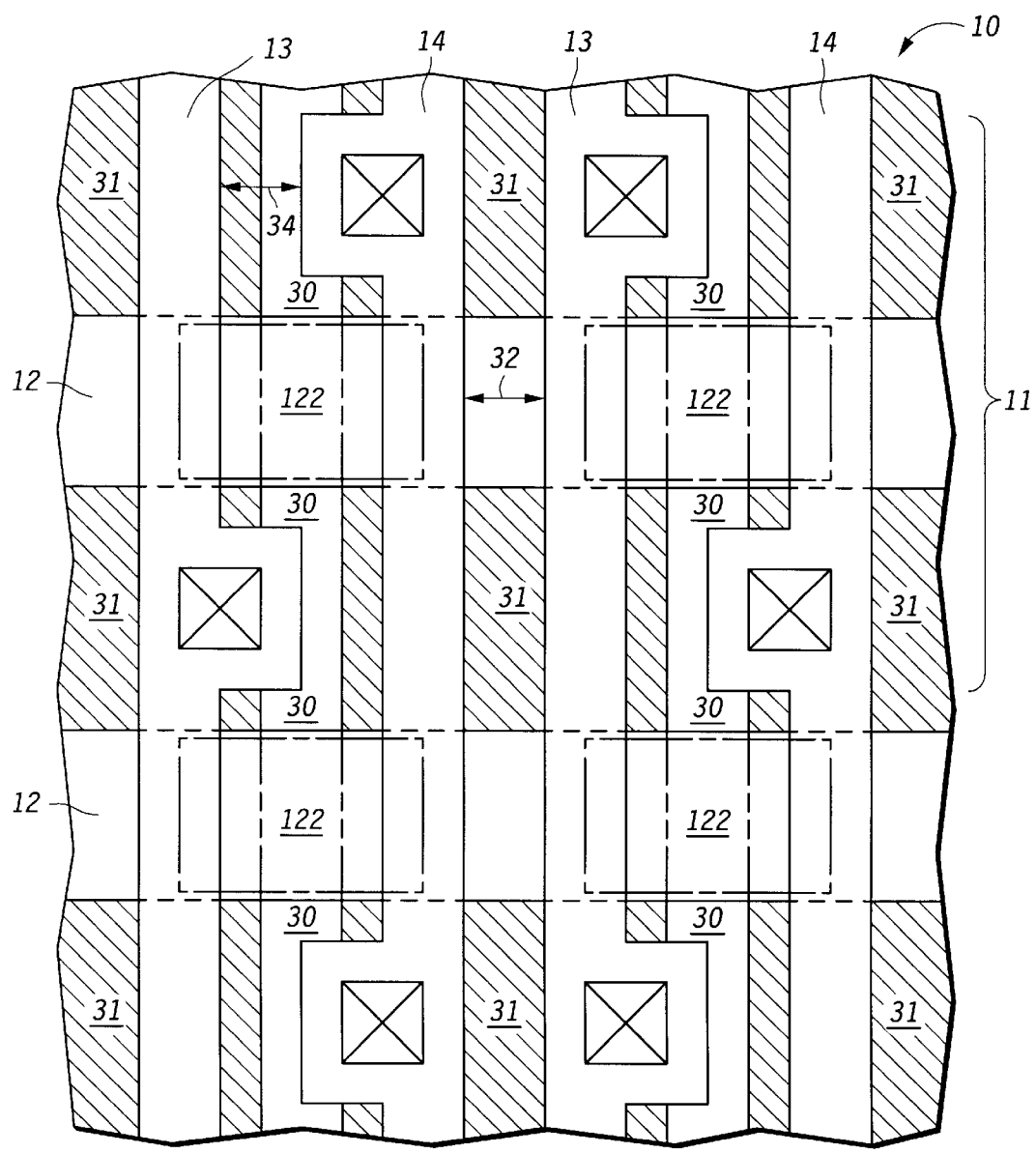
FIG. 3 includes an illustration of a plan view of a layout of the circuit diagram illustrated in FIG. 2 (prior art)
Figure 4:
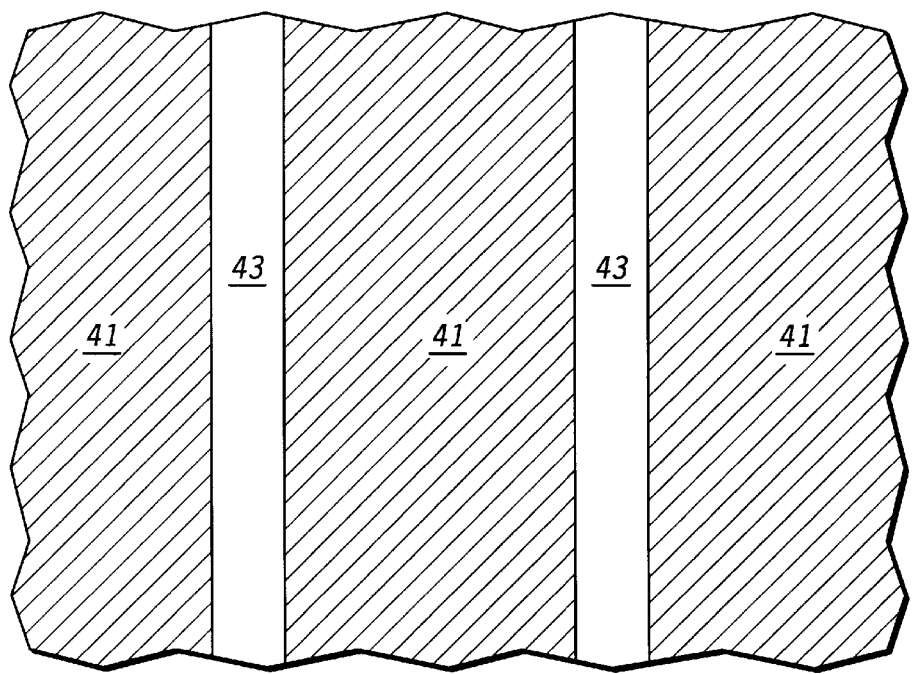
FIGS. 4–8 include plan views of a portion of a memory array during its formation.

FIG. 4 includes an illustration of a plan view of a portion of a memory array after defining active regions 43. As illustrated, field isolation regions 41 are formed between strips of active regions 43. Note that in this embodiment, the active regions 43 do not include the flags that would otherwise be seen with the prior art memory arrays. Unlike the memory array illustrated in FIG. 3, the active regions 43 in FIG. 4 are substantially straight columns without flags being formed underneath subsequently formed contacts. This has advantages in that corner rounding at flags, which occurs when forming the flags, does not occur at the active level because flags are formed. The field isolation regions 41 can be formed by shallow trench isolation or other conventional field isolation processes. A tunnel dielectric layer (not shown), which is a specific type of gate dielectric layer, is then formed over the active regions 43.

Figure 5:
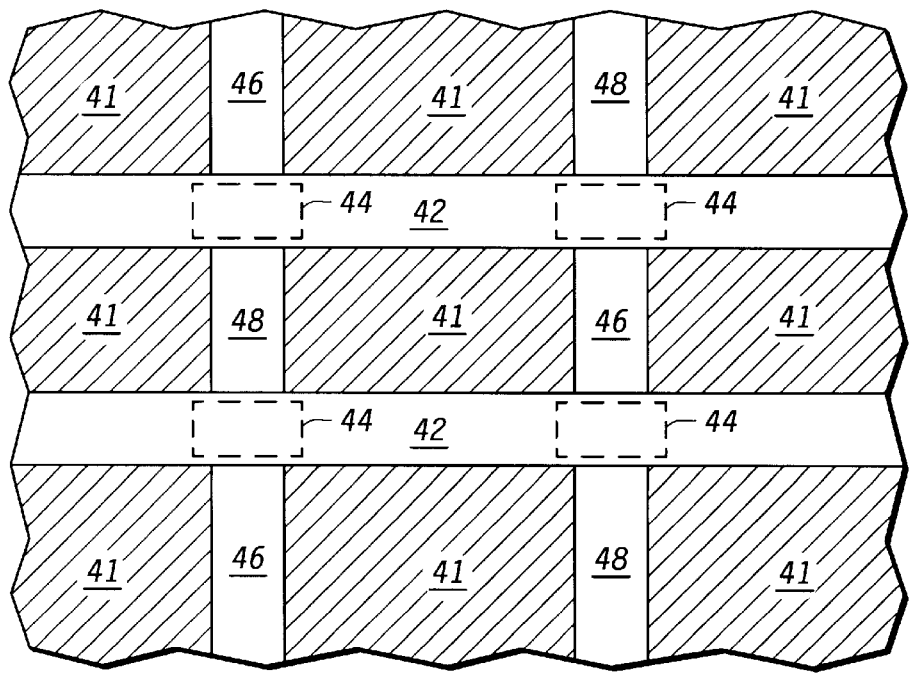

Floating gates 44 and word lines 42 are then formed as illustrated in FIG. 5. The floating gates 44 are formed by depositing a conductive layer of doped silicon and patterning the doped silicon into strips that run substantially parallel to the active regions 43 but are wider than the active regions 43. Therefore, the floating gates 44 overlie portions of the field isolation regions 41. An interlevel dielectric layer (not shown) is then formed over the first doped silicon layer after patterning. A second conductive layer, typically doped silicon or a polycide, is then deposited and patterned to form the word lines 42 as illustrated in FIG. 5. The word lines 42 include the control gates (control electrodes) for the memory cells and extend in a direction substantially perpendicular to the length of the active regions 43. During a second portion of the etching process, the horizontal edges of the floating gates 44 (as shown in FIG. 5) are formed. Therefore, the horizontal edges of the floating gates 44 and the word lines 42 in FIG. 5 are substantially coterminous with each other.

After the patterning of the word lines 42 and floating gates 44, a protective oxide, spacers, or both are typically formed but are not illustrated in FIG. 5. A doping step is performed to form the source regions 46 and the drain regions 48 from portions of the active regions. The source regions 46 and drain regions 48 are the current carrying electrodes of the memory cells. In this particular embodiment, the doping of the source regions 46 and drain regions 48 is performed simultaneously using the same dopant(s), energy(ies), and species. Compare this to many other electrically erasable floating gate memory cells, in which the source region doping is different from the drain region doping. For example, the source region may have a graded junction, and the drain region may have a very abrupt junction (halo implant only near drain region). Unlike those memory cells, source and drain regions of this embodiment have substantially the same depth and doping profile and concentration. Note the alternating pattern of the source and drain regions along each side of each word line 42 in FIG. 5. As will be explained later, the alternating source and drain regions allow farther shrinking of the memory array compared to other designs.

Figure 6:
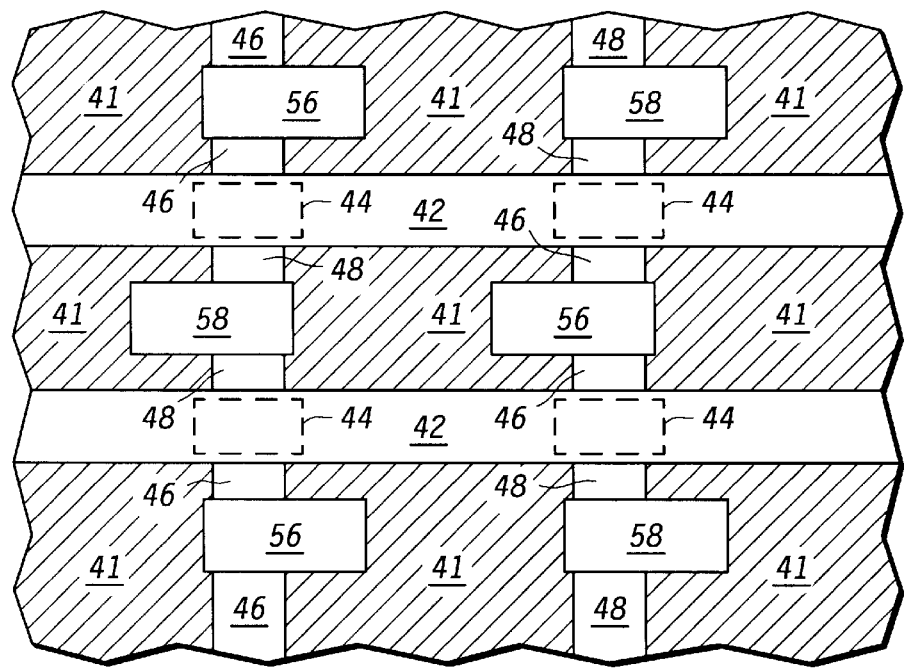

An insulating layer is then formed over all the memory array and is patterned to form openings where local interconnects 56 and 58 are formed. The local interconnects 56 and 58 are formed within the openings as shown in FIG. 6. In this particular embodiment, the local interconnects are conductive plugs that include an adhesion/barrier film of titanium/titanium nitride and a tungsten fill material. Other materials could be used for the conductive plugs. The local interconnects 56 extend towards the center of FIG. 6, and the drain local interconnects 58 extend away from the center of FIG. 6. The source local interconnects 56 make electrical contact to the source regions 46 and overlie portions of the field isolation regions 41. Similarly, the drain local interconnects 58 make electrical contact to the drain regions 48 and overlie portions of the field isolation regions 41.

Figure 7:
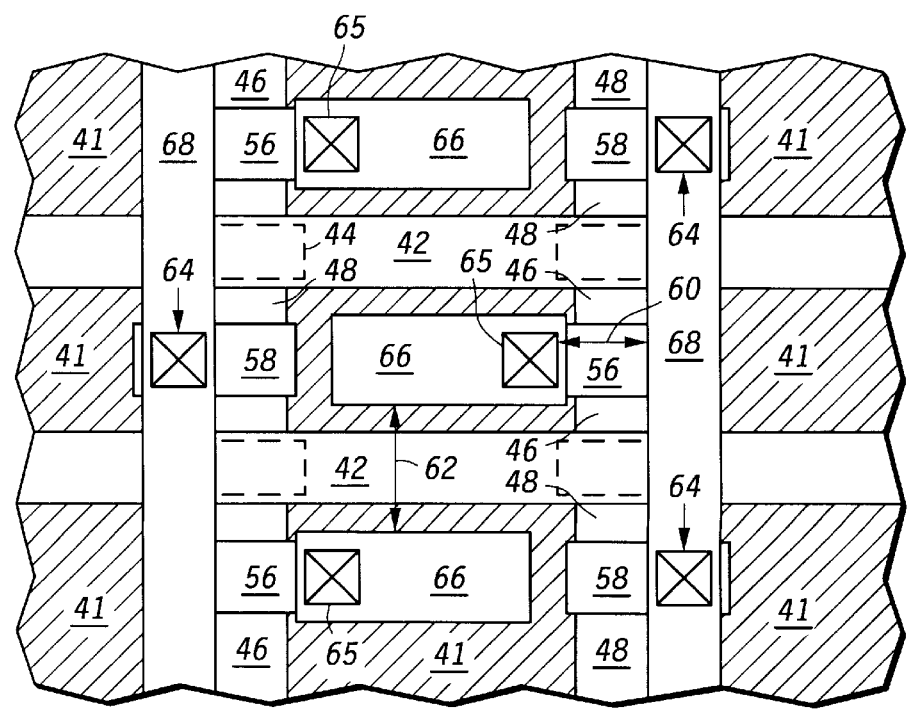

First level interconnects 66 and 68 are then formed as illustrated in FIG. 7. The drain bit lines 68 make contact to drain local interconnects 58 at locations as illustrated by the boxed Xs 64. Likewise, the landing pads 66 (for subsequent conductive plugs) make contact to source local interconnects 56 at locations as illustrated by the boxed Xs 65. The first level interconnects are typically made of mostly copper, aluminum, or other highly conductive material.

Two dimensions 60 and 62 are illustrated in FIG. 7. Dimension 60 is the minimum distance between any one of the landing pads 66 and the drain bit lines 68. Dimension is 62 is the minimum distance between any two landing pads 66. The minimum dimensions used depend on the limitations of the lithographic equipment and electronic design rules of the devices being formed. In this particular device, dimension 60 is smaller than dimension 62. Dimension 60 is typically in a range of approximately 0.1 to 0.3 microns, although smaller or larger dimensions can be used.

Figure 8:
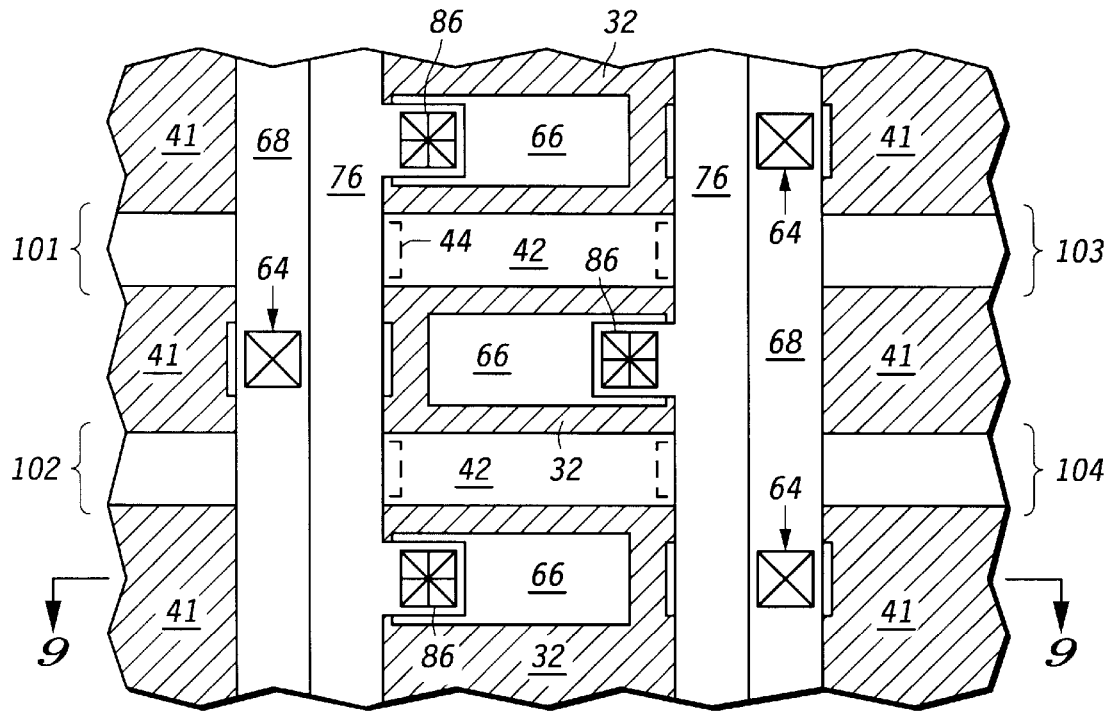

Processing continues and forms the second level interconnects that are the source bit lines 76 as illustrated in FIG. 8. Contacts between the source bit lines 76 and the landing pads 66 are illustrated by the asterisks within the boxes 86. The second level interconnects are made of mostly copper, aluminum, or other highly conductive material. Note that the source bit lines 76 overlie portions of the drain bit lines 68. Because the interconnects for the drain bit lines 68 and source bit lines 76 are at different interconnect levels, dedicated source and drain bit lines can be used and still achieve a smaller memory array compared to other memory cells where dedicated source and drain bit lines are formed at the same interconnect level (e.g., FIG. 3). Likewise, the placement of the local interconnects and contacts to the overlying interconnect levels are made without significant risk of electrical shorting due to misalignment.

FIG. 8 also includes notations showing the locations of the memory cells 101–104. In this particular embodiment, each of the pairs of memory cells 101 and 102 and memory cells 103 and 104 lie along rows. Each of the pairs of memory cells 101 and 103 and memory cells 102 and 104 lie along columns. The row and column configuration can be reversed in other embodiments.

Figure 9:
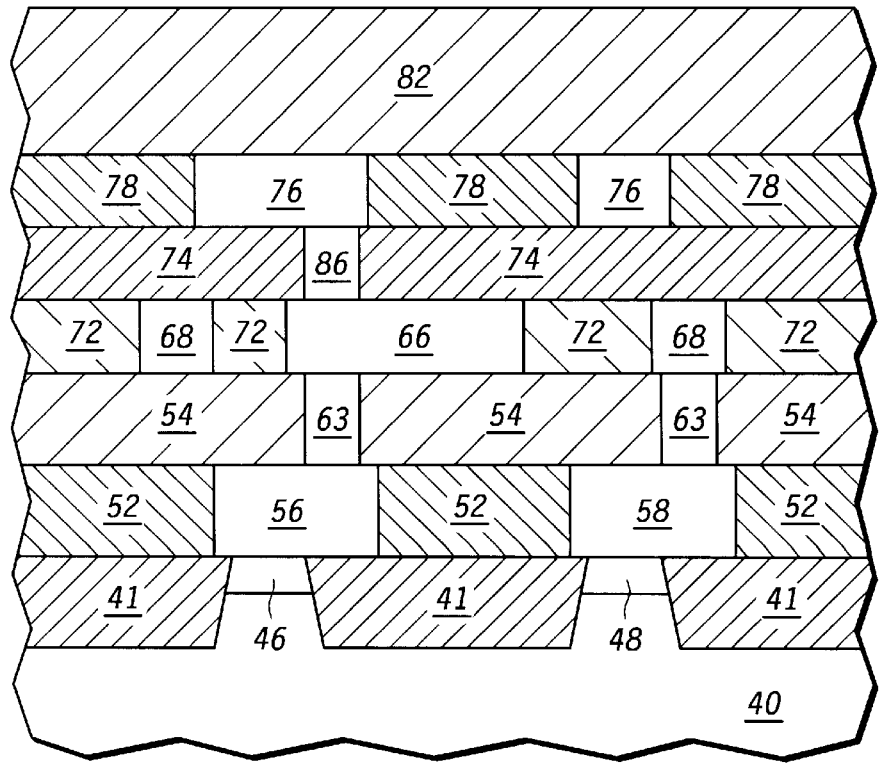
FIG. 9 includes an illustration of a cross-sectional view of a portion of the semiconductor substrate as illustrated by the sectioning lines 9—9 in FIG. 8.

FIG. 9 includes a cross-sectional view of a portion of the memory array shown by sectioning lines 9—9 in FIG. 8. Local interconnects 56 and 58 lie within openings extending through insulating layer 52, conductive plugs 63 lie within openings extending through insulating layer 54. Drain bit lines 68 and landing pad 66 lie within openings extending through insulating layer 72, conductive plug 86 lies within openings extending through insulating layer 74, and source bit lines 76 lie within openings extending through insulating layer 78. A passivation layer 82 overlies the uppermost level of interconnects.

In this particular embodiment, the source region 46 contacts the source local interconnect 56 and is electrically connected to one of the conductive plugs 63, the landing pad 66, conductive plug 86, and the source bit line 76 near the left-hand side of FIG. 9. The drain region 48 contacts the drain local interconnect 58 and is electrically connected to another conductive plug 63 and the drain bit line 68 near the right-hand side of FIG. 9.

The drain bit line 68 near the left-hand side of FIG. 9 does not make contact to the source region 46 but is electrically connected to drain regions along the same column as the source bit line 76 near the left-hand side of FIG. 9. The source bit line 76 near the right-hand side of FIG. 9 does not make contact to the drain region 48 but is electrically connected to source regions along the same column as the drain bit line 68 near the right-hand side of FIG. 9.

FIG. 9 includes p-well region 40. All floating gate memory cells within the floating gate memory array lie within this isolated p-well region 40. The p-well region 40 lies within a larger n-well region (not shown) that lies within a p-type substrate. All peripheral circuitry (row and column decoders, sense amplifiers and the like) and other circuitry (electrostatic protection circuitry, buffers and the like) do not necessarily lie within p-well region 40. The peripheral and other circuitry are conventional. Although the isolated p-well region 40 is not required, its use allows biasing during operation of the memory cells with a reduced likelihood of disturbing non-selected memory cells. The operations will be described later in this specification.

A couple of features help reduce the size of the memory array as used in this embodiment. For example, the local interconnects can be more closely spaced because the local interconnects 56 and 58 alternate directions that they extend from the source and drain regions 46 and 48, respectively, along the same column of memory cells. This allows the subsequent drain bit lines and source bit lines to be placed closer to other drain bit lines and other source bit lines, respectively, along different columns of memory cells.

The dedicated drain bit lines 68 and the dedicated source bit lines 76 are placed at different elevations compared each other to help further reduce the size of the memory array because one set of bit lines (e.g., source bit lines) can partially overlie or underlie the other set of bit lines (e.g., drain bit lines) within the same memory cell. If the elevations of the drain bit lines 68 would alternate between the first and second level of interconnects, or the elevations of the source bit lines 76 would alternate between the first and second level of interconnects, the memory array would likely have different electrical characteristics between even and odd columns within the memory array. The even/odd characteristics are usually undesired.

Turning to the embodiments herein, because all the drain bit lines 68 are at the same elevation, all the columns will have substantially the same resistance between the drain regions 48 within the substrate and the drain bit lines 68. Similarly, because all the source bit lines 76 are at the same elevation, all the columns will have substantially the same resistance between the source regions 46 within the substrate and the source bit lines 76.

Additionally, the source bit lines 76 are metallic and lie at an elevation higher than the control gates of word lines 42. If the source regions were connected in the silicon, with or without silicide, the active regions (see FIG. 4) would need to be modified which would in turn significantly increase the memory array area.

The operation of the memory cells has been designed to reduce the likelihood of write or erase disturbs of non-selected memory cells. Below is a table of potentials for one embodiment where memory cell 101 is to be programmed, erased, and read without significantly disturbing memory cells 102–104.

|  | Left SBL76 | Left DBL68 | Right SBL76 | Right DBL68 | Upper WL42 | Lower WL42 | Well Region40 |
| --- | --- | --- | --- | --- | --- | --- | --- |
| Program | x | −5 | +3 | +3 | +12 | +3 | −5 |
| Erase | +3 | +3 | +3 | +3 | −10 | 0 | +3 |
| Read | 0 | 1 | 0 | 0 | $V_{DD}$ | 0 | 0 | x denotes high impedance state (i.e., source region electrically floats)

Figure 10:
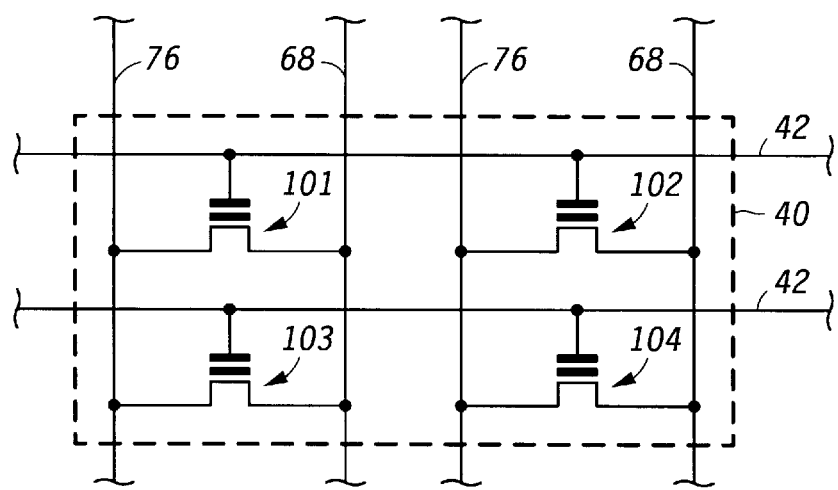
FIG. 10 includes a circuit schematic drawing of a portion of floating gate memory array in FIGS. 4–9.

Referring to FIG. 10, only cell 101 is programmed. The left-hand source bit line 76 is at a high impedance state. This allows the source region 46 for cell 101 to electrically float to approximately −5 volts. This occurs in less than a millisecond, and more typically, less than approximately one microsecond. In some particular embodiments, this can occur in approximately one nanosecond. In an alternative embodiment, the selected source bit line 76 can be biased to approximately −5 volts or pre-charged to approximately −5 volts before placing the left-hand source bit line 76 at a high impedance state. Also, the source and drain regions of memory cell 101 can be electrically tied to the same power supply electrode during programming. There is a potential difference of 17 volts between the upper word line 42, a portion of which is the control gate for cell 101, and the potentials of the source and drain regions 46 and 48, respectively.

The other memory cells 101–104 are not programmed because, within each unselected cell, the electrical field between any of the source and drain region 46 and 48, respectively, and its overlying word line 42 is less than the minimum threshold tunneling field. As used in this specification, the minimum threshold tunneling field for a memory cell is the lowest electrical field across a dielectric at which tunneling becomes significant. The dielectric may lie between the floating gate and the substrate or between the floating gate and the control gate. For a silicon dioxide dielectric, the minimum threshold tunneling field is approximately 7.0 megavolts per centimeter (MV/cm). Above 11.0 MV/cm, dielectric breakdown potential for silicon dioxide may occur. The minimum threshold tunneling field and dielectric breakdown potential may vary depending on the material of the dielectric.

For the unselected memory cells along the selected word line (row), the potential difference between the control gate (approximately +12 volts) and source and drain regions (approximately +3 volts) is approximately 9 volts. For unselected memory cells along the selected source and drain bit lines, the potential difference between the control gate (approximately +3 volts) and the source and drain regions (approximately −5 volts) is approximately 8 volts. These potentials result in an electric field across the dielectrics that are less than 7.0 MV/cm.

Unlike prior art solutions, inversion layers are formed within unselected memory cells. During programming, cells 101–103 are biased such that inversion layers are formed within the channel regions of the cells. The inversion layer within each cell lies just below the gate dielectric layer and extends the entire distance between the source and drain regions. In general terms, all memory cells along a selected row or column will have inversion layers formed during programming. Although inversion layers are formed, once steady state regarding potentials within the active regions of the memory cells is achieved (approximately one nanosecond, see above for more timing details), the source and drain regions within each of the memory cells 101–103 are at approximately the same potential. Therefore, the current flow between the source and drain regions of each of the memory cells 101–103 is less than approximately one nanoampere and usually will be less than approximately one picoampere or even approximately one femtoampere. During programming, memory cell 104 and all other memory cells within the memory that lie on an unselected row and column will not have inversion layers formed within their respective channel regions.

As future generations of semiconductor devices are made, these values of the potentials may be decreased. However, the electric fields for tunneling are expected to be relatively constant if the material of the dielectric is not changed. For programming, the selected drain bit line and the well region are at a negative bias, and the selected word line and unselected source and drain bit lines line are at positive potentials. The selected word line has a potential approximately 2–5 times higher than the unselected source and drain bit lines. The selected word line has an absolute value for approximately 1–3 times the absolute value of the selected drain bit line.

A first potential difference is between the upper (selected) word line 42 and each of the left (selected) drain bit line 68 and well region 40 is approximately 17 volts. A second potential difference is between the upper (selected) word line 42 and each of the right (unselected) source and drain bit lines 76 and 68, respectively is approximately 9 volts. A third potential difference is between the lower (unselected) word line 42 and each of the left (selected) drain bit line 68 and well region 40 is approximately 8 volts. A fourth potential difference between the lower (unselected) word line 42 and each of the right (unselected) source and drain bit lines 76 and 68, respectively is approximately 0 volts.

Again, with future generations of semiconductor device, the values of the differences may be decreased. The first potential difference should have an absolute value that is larger than the absolute value of each of the second, third, and fourth potentials. Typically, the absolute value of first potential difference is no greater than the absolute value of the non-zero potential differences (the second and third potential differences in this embodiment). Still, the first potential difference (approximately 17 volts) is at least 1.5 times higher than the next highest absolute value of one of the potential differences (i.e., the second potential difference (approximately 9 volts) in this embodiment).

Attention is now directed to erasing of memory cells 101 and 102 (selected row) without significantly disturbing memory cells 103 and 104 (unselected row). Both the left-hand and right-hand source and drain bit lines 76 and 68, respectively, and the well region 40 are biased to approximately +3 volts, and the upper word line 42 is biased to approximately −10 volts. Therefore, there is approximately a 13 volt difference between the control gate and source, drain, and well regions of memory cells 101 and 102.

The unselected memory cells 103 and 104 are not erased because the electrical fields across the dielectrics are less than the minimum threshold tunneling field. All cells on the selected word line (row) 42 are erased because the potential difference between the control gate (approximately −10 volts) and source and drain regions (approximately +3 volts) is approximately 13 volts. For unselected memory cells along the selected source and drain bit lines, the potential difference between the control gate (approximately 0 volts) and the source, drain, and well regions (approximately +3 volts) is 3 volts. Again, the electrical fields across the dielectrics are less than the minimum threshold tunneling field.

Similar to programming, the absolute values of potentials used for erasing may decrease with smaller devices, but the electrical fields needed to alter the charge in the floating gate using Fowler-Nordheim tunneling is expected to be relatively constant for a specific dielectric material. For erasing, the selected drain bit line and the well region are at a positive bias, and the selected word line and unselected source and drain bit lines are at negative potentials. The selected word line has an absolute value for approximately 2–5 times each of the absolute values of the selected and unselected source and drain bit lines. In an alternative embodiment, the selected source bit line may be put into a high impedance state, which allows the source region 46 of memory cell 101 to reach approximately +3 in a time period similar to the programming operation. In still other embodiments, the left-hand source bit line 76 can be pre-charged to approximately 3 volts before being put into a high impedance state. Also, the source and drain regions of memory cell 101 can be electrically tied to the same power supply electrode (i.e., $V_{DD}$) during erasing.

Reading the memory cells within the memory array is conventional. All the potentials of the word lines and source and drain bit lines are no lower than $V_{SS}$ (typically approximately 0 volts) and no higher than $V_{DD}$ (typically approximately 0.9 to 3.3 volts). The operations (programming, erasing, and reading) can be performed using conventional peripheral circuitry.

For programming and erasing, nearly all of the potentials have an absolute value of at least one volt. Only the lower word line 42 during erasing has a potential of substantially 0 volts.

For this example, the memory cells are programmed by injecting electrons into the floating gate and erased by removing electrons from the floating gate. If the memory cells are programmed by removing electrons and erased by injecting electrons, the polarities of the potentials are reversed (negative becomes positive and positive becomes negative). Either way alters the charge on the floating gate by using Fowler-Nordheim tunneling.

The potentials on the source and drain regions within each memory cell for programming and erasing are substantially the same. Therefore, the word line can have a minimum width, such as approximately 0.1–0.3 micron without having to be concerned with channel punchthrough. If the potential difference between the source and drain regions within any memory cell in the memory array is greater than the difference between $V_{SS}$ and $V_{DD}$, channel punchthrough is more likely when the word line width (channel length) is at minimum dimensions for the semiconductor device.

In this particular embodiment, the word line may have approximately 0.2 micron width, and each of the first and second interconnect pitches (combination of the minimum width of a feature and minimum width of a space at the same feature level) may be closer to approximately 0.5 micron. The channel region can be taken from approximately 0.2 micron wide to approximately 0.3 micron wide without having to adjust the memory cell layout other than just at the active region (e.g., field isolation feature level). The actual widths of the active regions to be used are determined at least in part on whether current drive (wider channel region) or programming speed (narrower channel region) is more important. Further, the same memory array can be segmented such that a portion of the memory array includes a wider channel region for higher current drive applications and another portion of the same memory array can have a narrower channel width for faster programming time applications. Skilled artisans can configure the semiconductor device to take advantage of these features within the same memory array.

Figure 11:
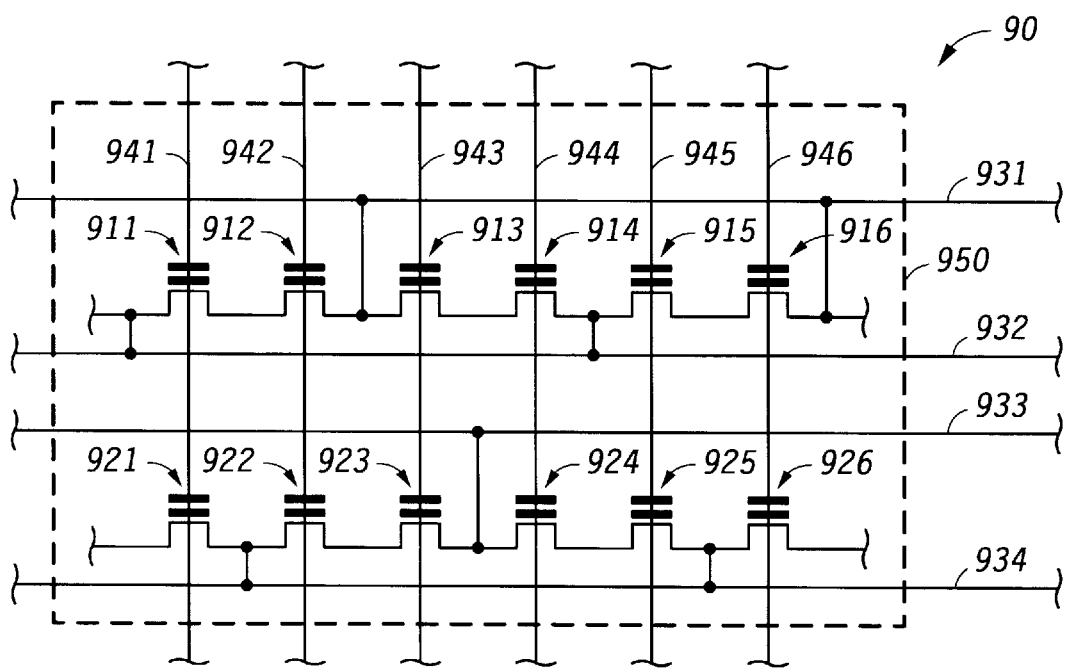
FIG. 11 includes a circuit schematic drawing of an alternative embodiment of the present invention.

FIG. 11 includes a circuit schematic drawing of an alternative embodiment. Memory cells 911–916 lie along one row, and memory cells 921–926 lie along an immediately adjacent row. Memory cells 911–916 and 921–926 lie within well region 950. Memory cells 911, 914, and 915 have their sources connected to source bit line 932, and memory cells 912, 913, and 916 have their drains connected to drain bit line 931. Memory cell 911 has its drain connected to the source of memory cell 912, memory cell 913 has its source connected to the drain of memory cell 914, and memory cell 915 has its drain connected to the source of memory cell 916. The layout and formation of the memory cells in FIG. 11 is similar to that seen with memory cells 101–104.

Memory cells 921, 922, 925, and 926 have their sources connected to source bit line 934, and memory cells 923 and 924 have their drains connected to drain bit line 933. Memory cell 922 has its drain connected to the source of memory cell 923, and memory cell 924 has its source connected to the drain of memory cell 925.

Control gates for memory cells 911 and 921 are part of word line 941, and control gates for memory cells 912 and 922 are part of word line 942. Control gates for memory cells 913 and 923 are part of word line 943, and control gates for memory cells 914 and 924 are part of word line 944. Control gates for memory cells 915 and 925 are part of word line 945, and control gates for memory cells 916 and 926 are part of word line 946.

Below are tables of potentials for one embodiment where memory cell 913 is to be programmed, erased, and read without significantly disturbing the other memory cells. All potentials are in volts. These voltages assume a low stored Vt is a range of approximately 0.5. to 1.0 volt, and a high stored Vt is in a range of approximately 2.0 to 3.0 volts.

|  | DBL 931 | SBL 932 | DBL 933 | SBL 934 | Well Region |
|---|---|---|---|---|---|
| Program | 0 | 0 | 4 | 4 | 4 |
| Erase | 0 | 0 | 0 | 0 | 0 |
| Read | * | 0 | 4 | 4 | 0 |

-continued

|  | WL 941 | WL 942 | WL 943 | WL 944 | WL 945 | WL 946 |
|---|---|---|---|---|---|---|
| Program | 4 | 4 | 12 | 4 | 4 | 4 |
| Erase | 0 | 0 | −15 | 0 | 0 | 0 |
| Read | 0 | 0 | 1.5 | 4 | 0 | 0 |

*less than 0.4 volt is low stored Vt, and greater than 1.0 volt if high stored Vt.

The prior discussion about decreasing potentials and electrical fields with respect to FIG. 10 also applies to the memory cells within FIG. 11. For programming, the selected source and drain bit lines are at a potential of substantially zero volts. The unselected source and drain bit lines, all word lines, and the well region are at positive potentials. The potential of the selected word line is in a range of approximately 2–5 times higher than the potential of each of the unselected word source and drain bit lines, unselected word lines, and the well region.

Unlike other two transistor memories, both transistors connected between a source bit line and a drain bit line, as shown in FIG. 11, are used for storage. The removal of the separate contact for each transistor allows for a smaller memory area, while maintaining the amount of data stored. This could be extended to any number of floating gate transistors in series.

Using either memory array previously described, a dense memory array can be formed that is less susceptible to disturb problems as seen in other similar memory cells or operating methods (programming, erasing, reading). Erasing of the memory cells can be performed such that memory cells can be either bit erasable or entire rows or columns or any number of memory cells can be erased at one time. Therefore, the same layout can be used for bit erasability or flash erasing. Further, the programming can be modified to do page write (program), erase, or read. The layout of the memory array and programming and erasing methods are particularly well suited for NOR-type memory architectures.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device having a memory array comprising:

memory cells;

a word line that includes control electrodes for a first plurality of the memory cells, a first bit line electrically connecting first current carrying electrodes for a second plurality of the memory cells; and a second bit line electrically connecting second current carrying electrodes of a third plurality of the memory cells; and wherein:

within the memory array, the first bit line, and the second bit line lie at different elevations compared to each other; and within the memory array, each of the first and second bit lines lies at an elevation higher than portions of the word line that includes gate electrodes.

2. The semiconductor device of claim 1, wherein:

the first bit line is a drain bit line;

the first current carrying electrodes are drain regions;

the second bit line is a source bit line;

the second current carrying electrodes are source regions; and within the memory array, the drain bit line lies at an elevation lower than the source bit line.

3. The semiconductor device of claim 1, wherein more than one of the memory cells are common to both the first and second bit lines.

4. The semiconductor device of claim 1, wherein within the memory array, the second bit line overlies at least part of the first bit line.

5. The semiconductor device of claim 1, wherein the second plurality of the memory cells and their plurality of the memory cells are electrically connected to a common bit line.

6. The semiconductor device of claim 1, wherein:

each of the memory cells include a transistor structure;

the transistor structure includes:

one of the control electrodes, wherein the control electrodes are gate electrodes;

one of the first current carrying electrodes, wherein the first current carrying electrodes are drain regions; and one of the second current carrying electrodes, wherein the second current carrying electrodes are source regions;

the word line extends in a first direction; and the first and second bit lines extend in a second direction that is substantially perpendicular to the first direction.

7. The semiconductor device of claim 6, wherein:

the memory cells further comprise floating gates.

8. The semiconductor device of claim 7, wherein the second plurality of the memory cells and the bird plurality of the memory cells ate electrically connected to a common bit line.

9. A semiconductor device having a memory array comprising:

a field isolation region;

memory cells each having a floating gate and a first current carrying electrode, wherein the first current carrying electrode abuts the field isolation region;

a conductive plug that is electrically connected to the first current carrying electrode, wherein the conductive plug abuts the first current carrying electrode and the field isolation region; and a first interconnect overlying and electrically connected to the conductive plug, wherein:

the first interconnect abuts the conductive plug at an abutting region; and from a plan view of the semiconductor device, most of the abutting region overlies the field isolation region.

10. The semiconductor device of claim 9, wherein the memory cells further comprise:

additional first current carrying electrodes, wherein all first current carrying electrodes are drain regions;

drain local interconnects are electrically connected to and lie between the drain regions and the first interconnect, wherein:

the first interconnect is a drain bit line; and from a plan view of the semiconductor device, each of the drain local interconnects has a length that is substantially perpendicular to the drain bit line;

source regions;

a source bit line substantially parallel to the drain bit line; and source local interconnects electrically connected to and lying between the source regions and the source bit line, wherein from a plan view of the semiconductor device, each of the source local interconnects has a length that is substantially perpendicular to the source bit line.

11. The semiconductor device of claim 10, wherein within the memory array, the source and drain bit lines are electrically connected to only one row or one column of memory cells.

12. The semiconductor device of claim 10, wherein within the memory array, the source bit line lies at a higher elevation compared to the drain bit line.

* * * * *

UNITED STATES PATENT AND TRADEMARK OFFICE
CERTIFICATE OF CORRECTION

PATENT NO. : 6,327,182 B1
DATED : December 4, 2001
INVENTOR(S) : Danny Pak-Chum Shum et al.

It is certified that error appears in the above-identified patent and that said Letters Patent is hereby corrected as shown below:

<u>Title page,</u>
Item [54], delete "OPERATION" and add -- OPERATING --.

<u>Column 11,</u>
Line 29, delete "their" and add -- the third --.
Line 49, delete "bird" and add -- third --.

Signed and Sealed this

Fourth Day of June, 2002

Attest:

Attesting Officer

JAMES E. ROGAN
*Director of the United States Patent and Trademark Office*